(12) United States Patent
Takata (10) Patent No.: US 9,093,980 B2
(45) Date of Patent: Jul. 28, 2015

(54) ELASTIC WAVE FILTER DEVICE

(71) Applicant: Murata Manufacturing Co., Ltd., Nagaokakyo-shi, Kyoto-fu (JP)

(72) Inventor: Toshiaki Takata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 249 days.

(21) Appl. No.: 13/863,478

(22) Filed: Apr. 16, 2013

(65) Prior Publication Data

US 2013/0229242 A1    Sep. 5, 2013

Related U.S. Application Data

(63) Continuation of application No. PCT/JP2011/064205, filed on Jun. 22, 2011.

(30) Foreign Application Priority Data

Nov. 9, 2010   (JP) ................................. 2010-251079

(51) Int. Cl.
*H03H 9/64* (2006.01)
*H03H 9/72* (2006.01)
*H03H 9/05* (2006.01)

(52) U.S. Cl.
CPC ............... *H03H 9/64* (2013.01); *H03H 9/0576* (2013.01); *H03H 9/6483* (2013.01); *H03H 9/725* (2013.01)

(58) Field of Classification Search
CPC . H03H 9/6406; H03H 9/6423; H03H 9/6426; H03H 9/6483; H03H 9/6493; H03H 9/72; H03H 9/542; H03H 9/059; H03H 9/1085; H03H 9/02559; H03H 9/0222; H03H 9/0576; H03H 9/64; H03H 9/725

USPC .......................................... 333/133, 193–195
See application file for complete search history.

(56) References Cited

U.S. PATENT DOCUMENTS

| | | | |
|---|---|---|---|
| 6,417,574 B1 | 7/2002 | Misawa et al. | |
| 6,747,530 B1 * | 6/2004 | Selmeier | 333/193 |
| 6,819,203 B2 * | 11/2004 | Taniguchi | 333/193 |
| 6,903,631 B2 * | 6/2005 | Kushitani et al. | 333/193 |
| 7,116,187 B2 * | 10/2006 | Inoue | 333/133 |
| 7,242,271 B2 * | 7/2007 | Komazaki | 333/193 |
| 7,436,273 B2 * | 10/2008 | Onozawa | 333/193 |

(Continued)

FOREIGN PATENT DOCUMENTS

| | | |
|---|---|---|
| CN | 1489286 A | 4/2004 |
| CN | 101079609 A | 11/2007 |

(Continued)

OTHER PUBLICATIONS

Official Communication issued in International Patent Application No. PCT/JP2011/064205, mailed on Sep. 13 2011.

*Primary Examiner* — Barbara Summons
(74) *Attorney, Agent, or Firm* — Keating & Bennett, LLP (57) ABSTRACT

An elastic wave filter device includes a ladder filter unit, a first inductor, a second inductor, and a capacitor. The ladder filter unit includes at least three parallel arms including a first parallel arm. The first inductor is connected between the first parallel arm and a ground potential. The second inductor is connected between at least two of the parallel arms, other than the first parallel arm among the at least three parallel arms, and the ground potential. The capacitor is connected between a connection point of the first parallel arm and the first inductor and a connection point of the second inductor and the at least two parallel arms.

18 Claims, 8 Drawing Sheets

(56) References Cited

U.S. PATENT DOCUMENTS

| | | | |
|---|---|---|---|
| 7,456,705 B2 * | 11/2008 | Ito | 333/133 |
| 7,573,354 B2 * | 8/2009 | Nishihara et al. | 333/133 |
| 2004/0085161 A1 | 5/2004 | Kushitani et al. | |
| 2005/0190015 A1 | 9/2005 | Komazaki | |
| 2007/0030096 A1 | 2/2007 | Nishihara et al. | |
| 2007/0268092 A1 | 11/2007 | Inoue et al. | |
| 2009/0058555 A1 * | 3/2009 | Takata et al. | 333/129 |
| 2010/0188166 A1 | 7/2010 | Hara et al. | |

FOREIGN PATENT DOCUMENTS

| | | | |
|---|---|---|---|
| JP | 10-284987 | * | 10/1998 |
| JP | 2000-295070 | * | 10/2000 |
| JP | 2001-053577 A | | 2/2001 |
| JP | 2002-300003 A | | 10/2002 |
| JP | 2004-072411 A | | 3/2004 |
| JP | 2005-278131 A | | 10/2005 |
| JP | 2007-074698 A | | 3/2007 |
| JP | 2010-177770 A | | 8/2010 |

\* cited by examiner

ELASTIC WAVE FILTER DEVICE

BACKGROUND OF THE INVENTION

1. Field of the Invention

The present invention relates to an elastic wave filter device.

2. Description of the Related Art

Figure 14:
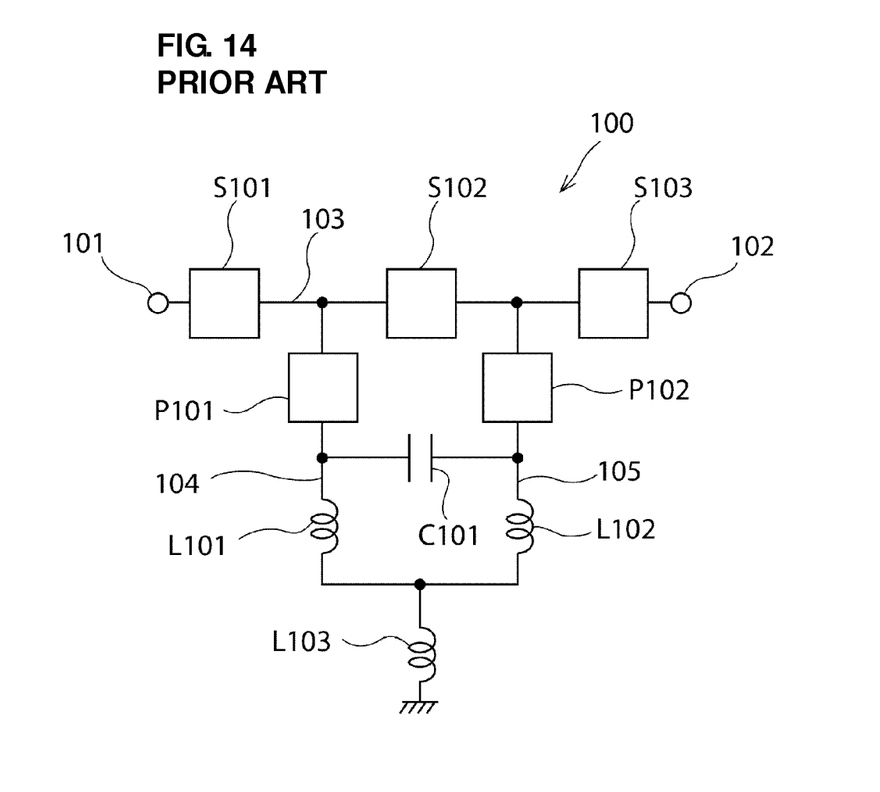
FIG. 14 is a schematic circuit diagram of a surface acoustic wave filter device described in Japanese Unexamined Patent Application Publication No. 2004-72411.

Elastic wave filter devices utilizing elastic waves, such as surface acoustic waves or boundary acoustic waves, have been widely used as filter devices. As one type of such elastic wave filter devices, a ladder surface acoustic wave filter device is disclosed in Japanese Unexamined Patent Application Publication No. 2004-72411. FIG. 14 illustrates a schematic circuit diagram of the surface acoustic wave filter device described in Japanese Unexamined Patent Application Publication No. 2004-72411.

In a surface acoustic wave filter device 100 illustrated in FIG. 14, multiple series arm resonators S101 to S103 are connected in series in a series arm 103 that connects signal terminals 101 and 102. First and second parallel arms 104 and 105 are provided between the series arm 103 and a ground potential. The parallel arms 104 and 105 are provided with parallel arm resonators P101 and P102, respectively. An inductor L101 is connected between the parallel arm resonator P101 and the ground potential. An inductor L102 is connected between the parallel arm resonator P102 and the ground potential. An inductor L103 is connected between a connection point of the inductors L101 and L102 and the ground potential. A capacitor C101 is connected between a connection point of the parallel arm resonator P101 and the inductor L101 and a connection point of the parallel arm resonator P102 and the inductor L102.

Japanese Unexamined Patent Application Publication No. 2004-72411 describes that attenuation at frequencies lower than those of a pass band can be increased by providing the inductors L101 to L103 and the capacitor C101.

In elastic wave filter devices, there has been a demand for an increase in attenuation of harmonics, e.g., second and third harmonics of a pass band. However, the surface acoustic wave filter device 100 is incapable of sufficiently increasing attenuation of harmonics.

SUMMARY OF THE INVENTION

Preferred embodiments of the present invention provide a ladder elastic wave filter device that achieves large attenuation of harmonics and that is compact.

An elastic wave filter device according to a preferred embodiment of the present invention includes a ladder filter unit, a first inductor, a second inductor, and a capacitor. The ladder filter unit includes first and second signal terminals, a series arm, a plurality of series arm resonators, at least three parallel arms, and parallel arm resonators. The series arm connects the first and second signal terminals. The plurality of series arm resonators are connected in series in the series arm. The at least three parallel arms connect the series arm and a ground potential. The at least three parallel arms include a first parallel arm. The parallel arm resonators are provided in the respective at least three parallel arms. The first inductor is connected between the first parallel arm and the ground potential. The second inductor is connected between at least two of the parallel arms, other than the first parallel arm among the at least three parallel arms, and the ground potential. The capacitor is connected between a connection point of the first parallel arm and the first inductor and a connection point of the second inductor and the at least two parallel arms.

In a preferred embodiment of the elastic wave filter device according to the present invention, the first and second inductors are configured such that an attenuation pole generated by the first inductor is located on a higher frequency side with respect to an attenuation pole generated by the second inductor.

In another preferred embodiment of the elastic wave filter device according to the present invention, the first and second inductors are configured such that the attenuation pole generated by the second inductor is located in a frequency band corresponding to a second harmonic of a pass band, and the attenuation pole generated by the first inductor is located in a frequency band corresponding to a third harmonic of the pass band.

In another preferred embodiment of the elastic wave filter device according to the present invention, the elastic wave filter device includes a filter chip and a wiring board. The ladder filter unit is provided in the filter chip. The filter chip is mounted on the wiring board. Electrodes that define the first and second inductors are provided on the wiring board.

In still another preferred embodiment of the elastic wave filter device according to the present invention, the elastic wave filter device does not include an inductor connected between all of the at least three parallel arms and the ground potential.

In another preferred embodiment of the elastic wave filter device according to the present invention, the elastic wave filter device is a surface acoustic wave filter device or a boundary acoustic wave filter device.

According to various preferred embodiments of the present invention, a ladder elastic wave filter device that achieves large attenuation of harmonics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below taking, as an example, a surface acoustic wave branching filter 1 illustrated in FIG. 1, which is a surface acoustic wave duplexer. Note that the surface acoustic wave branching filter 1 is merely an example. The present invention is not limited to the surface acoustic wave branching filter 1. An elastic wave filter device according to a preferred embodiment of the present invention may be, for example, a filter device including only one filter unit or may be a triplexer or other suitable filter including three filter units.

The surface acoustic wave branching filter 1 according to the present preferred embodiment is a surface acoustic wave duplexer preferably used for Universal Mobile Telecommunications System band 5 (UMTS-BAND5) (transmission frequency band: 824 MHz to 849 MHz, reception frequency band: 869 MHz to 894 MHz), for example.

Figure 1:
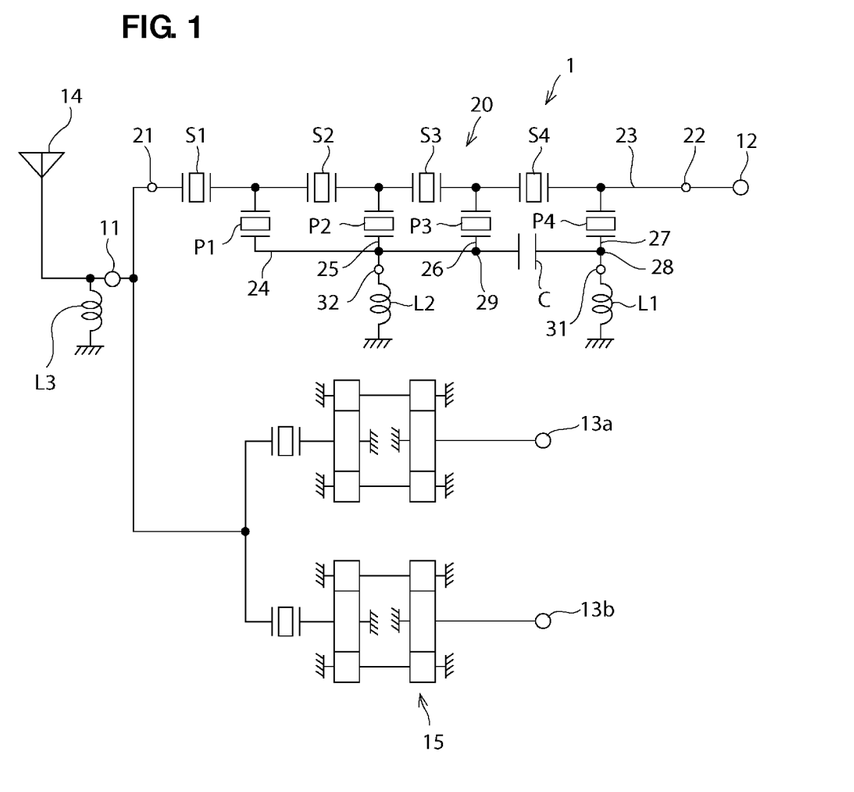
FIG. 1 is a schematic circuit diagram of a surface acoustic wave branching filter according to a preferred embodiment of the present invention.

FIG. 1 is a schematic circuit diagram of the surface acoustic wave branching filter according to the preferred embodiment. A circuit configuration of the surface acoustic wave branching filter 1 according to the present preferred embodiment will be described with reference to FIG. 1.

The surface acoustic wave branching filter 1 includes an antenna terminal 11 connected to an antenna 14, a transmission-side signal terminal 12, and first and second reception-side signal terminals 13a and 13b. A reception-side filter unit 15 defined by a balanced-type longitudinally coupled resonator-type surface acoustic wave filter unit having a balanced-unbalanced transforming function is connected between the antenna terminal 11 and the first and second reception-side signal terminals 13a and 13b. A transmission-side filter unit 20 defined by a ladder filter unit is connected between the antenna terminal 11 and the transmission-side signal terminal 12. A matching inductor L3 is connected between a connection point of the antenna 14 and the antenna terminal 11 and a ground potential.

The transmission-side filter unit 20 includes first and second signal terminals 21 and 22. The first and second signal terminals 21 and 22 are connected by a series arm 23. Multiple series arm resonators S1 to S4 are connected in series in the series arm 23. At least three parallel arms are provided between the series arm 23 and the ground potential. Specifically, in the present preferred embodiment, four parallel arms 24 to 27 arranged to connect the series arm 23 and the ground potential are provided. Parallel arm resonators P1 to P4 are provided in the parallel arms 24 to 27, respectively.

An inductor L1 is connected between the parallel arm 27 and the ground potential. An inductor L2 is connected between at least two of the parallel arms 24 to 26 and the ground potential. Specifically, in the present preferred embodiment, all of the parallel arms 24 to 26 are connected to the ground potential via the inductor L2.

A capacitor C is connected between a connection point 28 of the parallel arm 27 and the inductor L1 and a connection point 29 of the parallel arms 24 to 26 and the inductor L2.

In the present preferred embodiment, the inductors L1 and L2 are configured such that an attenuation pole generated by the inductor L1 is located on a higher frequency side with respect to an attenuation pole generated by the inductor L2. More specifically, in the present preferred embodiment, the inductors L1 and L2 are configured such that the attenuation pole generated by the inductor L1 is located in a frequency band corresponding to a third harmonic of a pass band of the transmission-side filter unit 20, and the attenuation pole generated by the inductor L2 is located in a frequency band corresponding to a second harmonic of the pass band of the transmission-side filter unit 20. This configuration increases attenuation in each of the frequency bands corresponding to the second and third harmonics.

In the present preferred embodiment, an inductor is not connected between all the parallel arms 24 to 27 and the ground potential.

Figure 2:
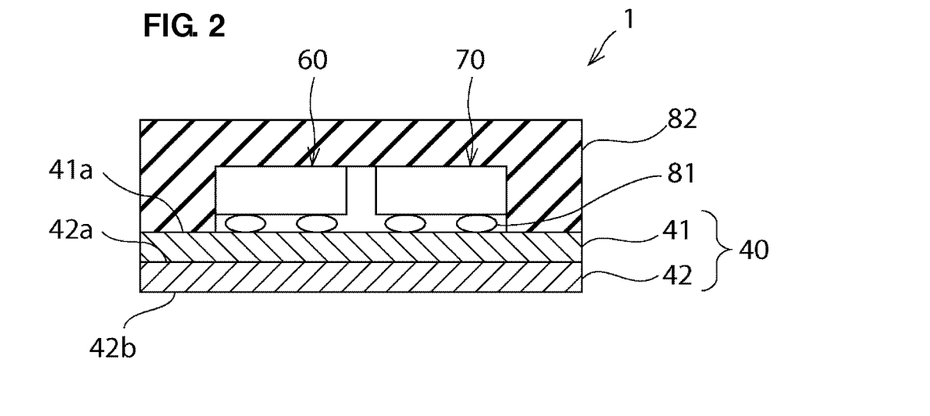
FIG. 2 is a schematic cross-sectional view of the surface acoustic wave branching filter according to the preferred embodiment of the present invention.
Figure 3:
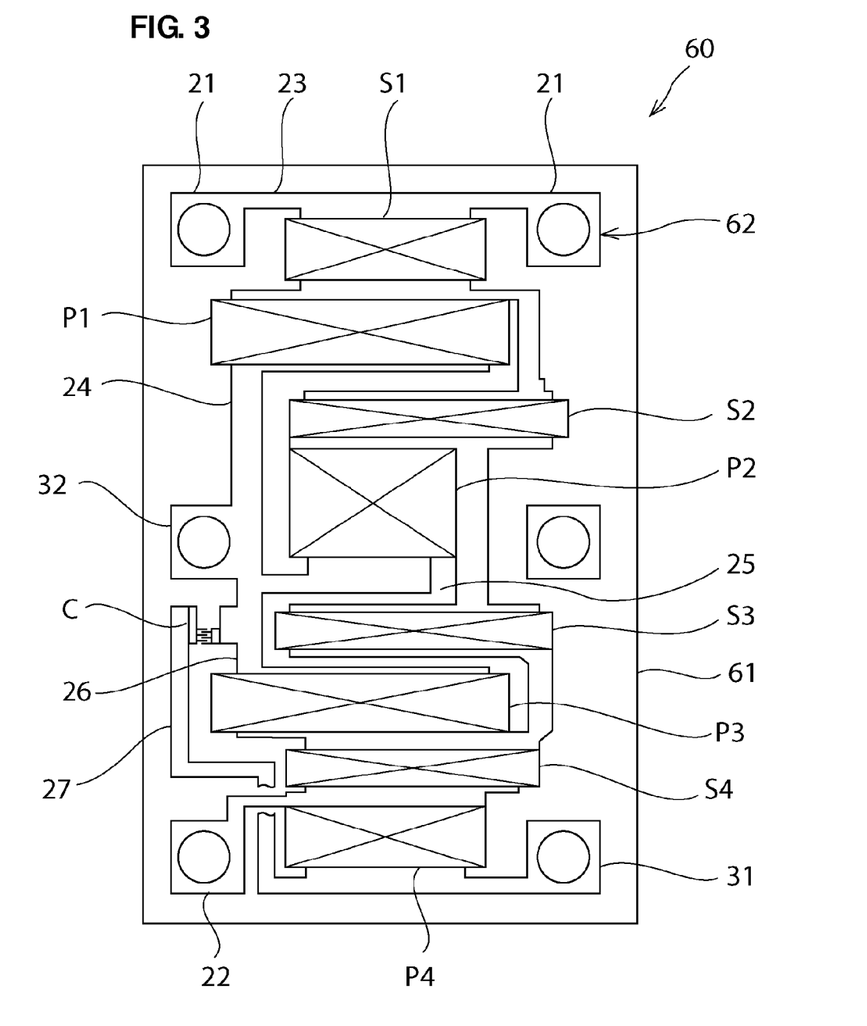
FIG. 3 is a schematic perspective plan view of a transmission-side filter chip in a preferred embodiment of the present invention.
Figure 4:
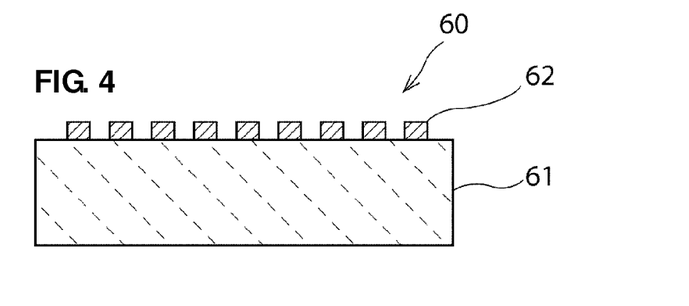
FIG. 4 is a schematic cross-sectional view in which a portion of the transmission-side filter chip in a preferred embodiment of the present invention is enlarged.
Figure 5:
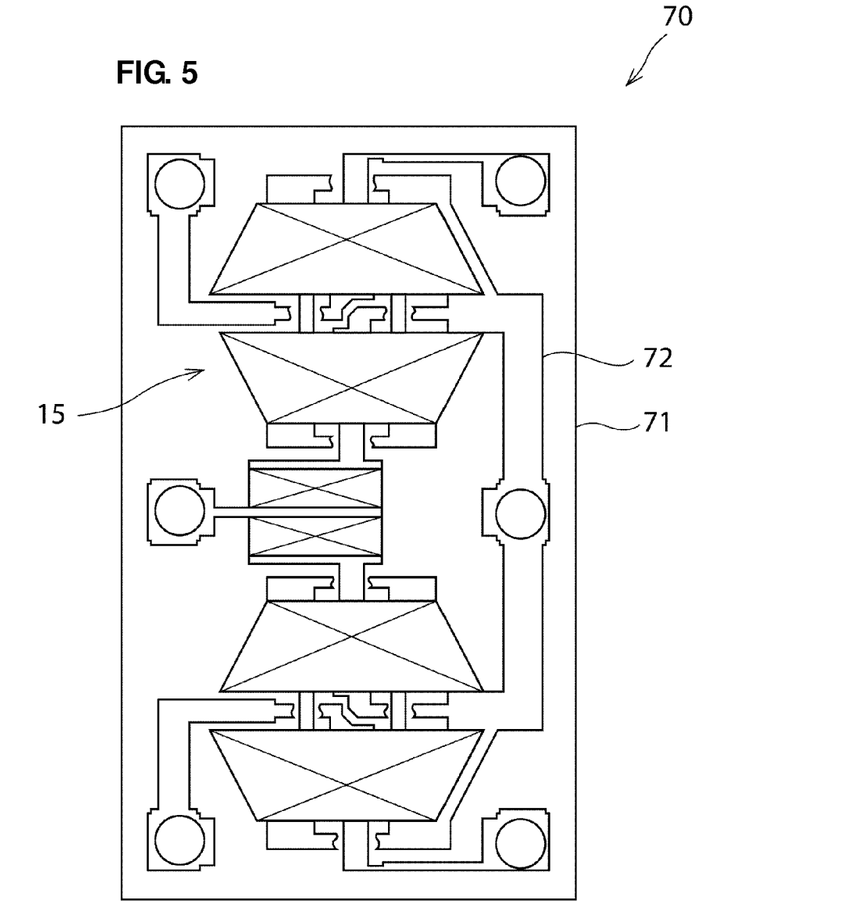
FIG. 5 is a schematic perspective plan view of a reception-side filter chip in a preferred embodiment of the present invention.
Figure 6:
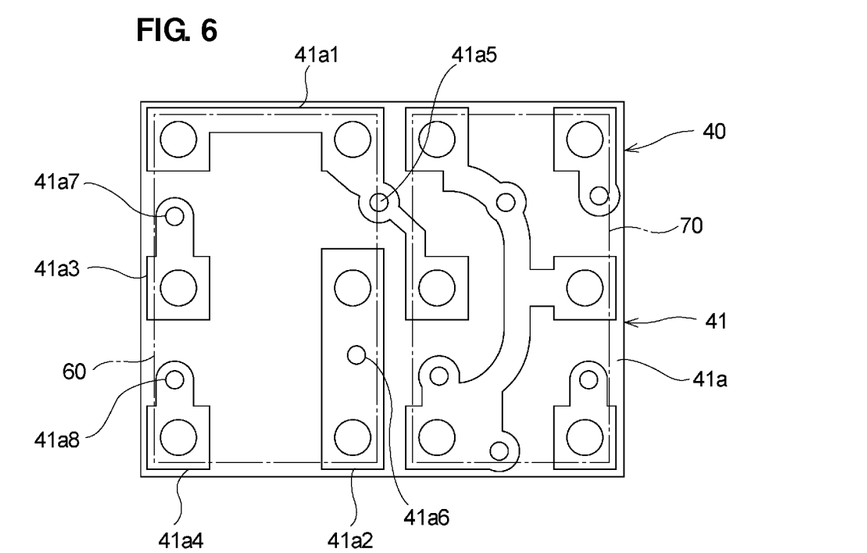
FIG. 6 is a schematic perspective plan view of a front surface of a first dielectric layer.
Figure 7:
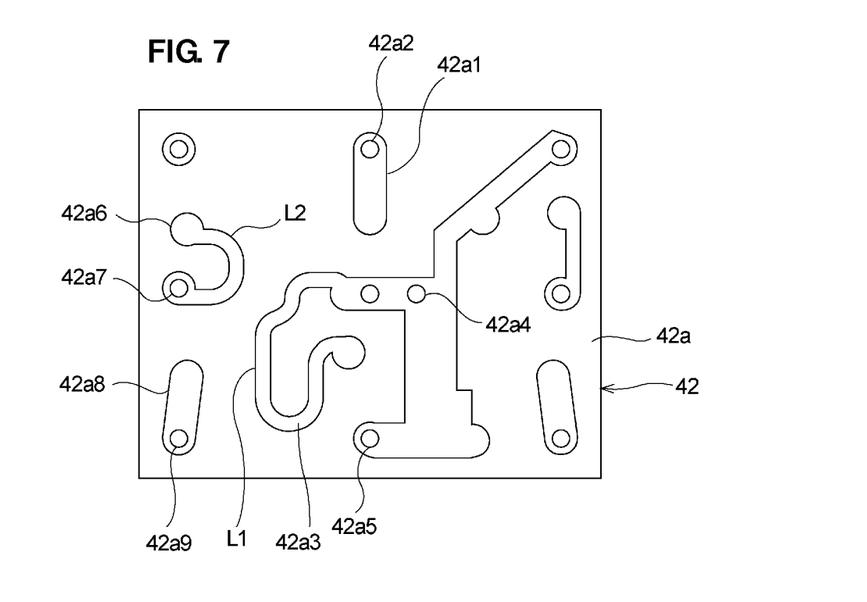
FIG. 7 is a schematic perspective plan view of a front surface of a second dielectric layer.
Figure 8:
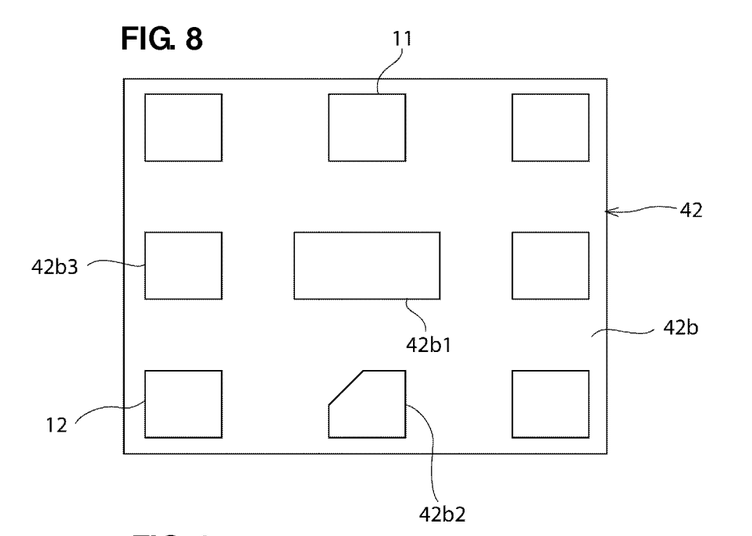
FIG. 8 is a schematic perspective plan view of a rear surface of the second dielectric layer.

FIG. 2 is a schematic cross-sectional view of the surface acoustic wave branching filter. FIG. 3 is a schematic perspective plan view of a transmission-side filter chip. FIG. 4 is a schematic cross-sectional view in which a portion of the transmission-side filter chip is enlarged. FIG. 5 is a schematic perspective plan view of a reception-side filter chip. FIG. 6 is a schematic perspective plan view of a front surface of a first dielectric layer. FIG. 7 is a schematic perspective plan view of a front surface of a second dielectric layer. FIG. 8 is a schematic perspective plan view of a rear surface of the second dielectric layer. In FIGS. 3 and 5, interdigital transducer (IDT) electrodes, capacitors, and other elements are schematically illustrated. Illustration of some components such as reflectors is omitted.

A specific configuration of the surface acoustic wave branching filter 1 of the present preferred embodiment will be described with reference to FIGS. 2 to 8.

As illustrated in FIG. 2, the surface acoustic wave branching filter 1 includes a wiring board 40, a transmission-side filter chip 60, and a reception-side filter chip 70. The transmission-side filter chip 60 and the reception-side filter chip 70 are flip-chip mounted on a die-attach surface of the wiring board 40 via bumps 81. The transmission-side filter chip and the reception-side filter chip 70 are sealed with a sealing resin layer 82 provided on the wiring board 40.

The transmission-side filter chip 60 includes the transmission-side filter unit 20 and the capacitor C. Specifically, as illustrated in FIGS. 3 and 4, the transmission-side filter chip 60 includes a piezoelectric substrate 61 and an electrode 62 provided on the piezoelectric substrate 61. The electrode 62 includes IDT electrodes, reflectors, a pair of comb-shaped electrodes interdigitated with each other, the series arm 23, the parallel arms 24 to 27, the first and second signal terminals 21 and 22, and ground terminals 31 and 32. The IDT electrodes and the reflectors define each of the series arm resonators S1 to S4 and parallel arm resonators P1 to P4. The pair of comb-shaped electrodes define the capacitor C.

The reception-side filter chip 70 includes the reception-side filter unit 15. Specifically, as illustrated in FIG. 5, the reception-side filter chip 70 includes a piezoelectric substrate 71 and an electrode 72 provided on the piezoelectric substrate 71. The piezoelectric substrate 71 and the electrode 72 define the reception-side filter unit 15.

Each of the piezoelectric substrates 61 and 71 may preferably be made of, for example, LiNbO$_3$ or LiTaO$_3$. The electrodes 62 and 72 may preferably be made of, for example, a metal selected from a group consisting of Al, Pt, Au, Ag, Cu, Ni Ti, Cr, and Pd, or an alloy containing at least one metal selected from a group consisting of Al, Pt, Au, Ag, Cu, Ni, Ti Cr, and Pd. The electrodes 62 and 72 may preferably be made of a laminate including multiple metal layers made of the foregoing metal or alloy.

The wiring board 40 includes the inductors L1 and L2. Specifically, as illustrated in FIG. 2, the wiring board 40 is preferably a laminate including first and second dielectric layers 41 and 42. The reception-side filter chip 70 and the transmission-side filter chip 60 are mounted on a front surface 41a, which defines a die-attach surface, of the first dielectric layer 41.

As illustrated in FIG. 6, on the front surface 41a of the first dielectric layer 41, an electrode pad 41a1 to which the first signal terminal 21 is connected, an electrode pad 41a2 to which the ground terminal 31 is connected, an electrode pad 41a3 to which the ground terminal 32 is connected, and an electrode pad 41a4 to which the second signal terminal 22 is connected are provided.

The electrode pad 41a1 is connected to an electrode 42a1 (see FIG. 7) provided on a front surface 42a of the second dielectric layer 42 through a via hole electrode 41a5. The electrode 42a1 is connected to the antenna terminal 11 (see FIG. 8) provided on a rear surface 42b of the second dielectric layer 42 through a via hole electrode 42a2.

The electrode pad 41a2 illustrated in FIG. 6 is connected to an electrode 42a3 (see FIG. 7) provided on the front surface 42a of the second dielectric layer 42 through a via hole electrode 41a6. The electrode 42a3 defines the inductor L1. The electrode 42a3 is connected to ground terminals 42b1 and 42b2 (see FIG. 8) provided on the rear surface 42b of the second dielectric layer 42 through via hole electrodes 42a4 and 42a5.

The electrode pad 41a3 illustrated in FIG. 6 is connected to an electrode 42a6 (see FIG. 7) provided on the front surface 42a of the second dielectric layer 42 through a via hole electrode 41a7. The electrode 42a6 defines the inductor L2. The electrode 42a6 is connected to a ground terminal 42b3 (see FIG. 8) provided on the rear surface 42b of the second dielectric layer 42 through a via hole electrode 42a7.

In the present preferred embodiment, the inductor L3 includes an external chip coil, but may be provided in the wiring board 40, similar to the inductors L1 and L2. In this case, a connection point 33 is disposed between a connection point of the transmission-side filter unit 20 and the reception-side filter unit 15 and the antenna terminal 11.

The electrode pad 41a4 illustrated in FIG. 6 is connected to an electrode 42a8 (see FIG. 7) provided on the front surface 42a of the second dielectric layer 42 through a via hole electrode 41a8. The electrode 42a8 is connected to the transmission-side signal terminal 12 (see FIG. 8) provided on the rear surface 42b of the second dielectric layer 42 through a via hole electrode 42a9.

As described above, in the present preferred embodiment, the capacitor C is provided. Thus, an inductance value required for the inductor L1 is decreased. As a result, the length of the electrode 42a3 that defines the inductor L1 is shortened and the size of the wiring board 40 is reduced. The size of the surface acoustic wave branching filter 1 is therefore reduced.

The effects of preferred embodiments of the present invention will be described in detail on the basis of specific non-limiting examples of preferred embodiments of the present invention and comparative examples.

Figure 9:
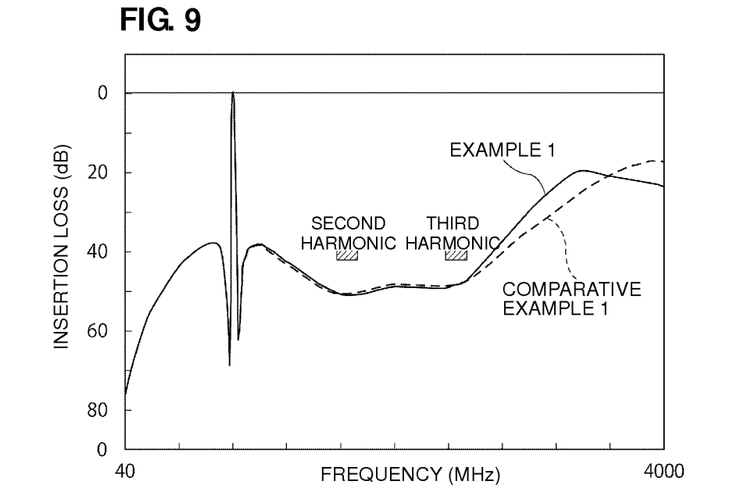
FIG. 9 is a graph illustrating insertion loss characteristics between first and second signal terminals of respective surface acoustic wave branching filters according to an Example 1 of a preferred embodiment of the present invention and a Comparative Example 1.

In Example 1, a surface acoustic wave branching filter having substantially the same configuration as that of the surface acoustic wave branching filter 1 of the above-described preferred embodiment was fabricated according to the following design parameters. Insertion losses between first and second signal terminals 21 and 22 of the surface acoustic wave branching filter were measured. FIG. 9 illustrates the results.

Design Parameters in Example 1

Intersecting width of series arm resonator:
S1: about 80 μm, S2: about 50 μm, S3: about 50 μm, S4: about 50 μm
Intersecting width of parallel arm resonator:
P1: about 100 μm, P2: about 160 μm, P3: about 100 μm, P4: about 100 μm
Number of pairs of electrode fingers in series arm resonator:
S1: 70 pairs, S2: 100 pairs, S3: 100 pairs, S4: 90 pairs
Number of pairs of electrode fingers in parallel arm resonator:
P1: 100 pairs, P2: 50 pairs, P3: 100 pairs, P4: 60 pairs
Capacitance of capacitor C: about 1.0 pF
Inductance value of inductor L1: about 0.7 nH
Inductance value of inductor L2: about 0.3 nH In Comparative Example 1, a surface acoustic wave branching filter having substantially the same configuration as that in Example 1 was fabricated, except that a capacitor C was not provided and the inductance value of an inductor L1 was about 1.5 nH. Insertion losses between first and second signal terminals of the surface acoustic wave branching filter were measured. FIG. 9 illustrates the results.

As illustrated in FIG. 9, attenuation in frequency bands of second and third harmonics in Example 1, in which the inductor L1 had a low inductance value of about 0.7 nH, was substantially equal to that in Comparative Example 1, in which the inductor L1 had a high inductance value of about 1.5 nH. It is understood from the results that attenuation in the frequency bands of the second and third harmonics can be increased by providing the capacitor C, even if the inductance value of the inductor L1 is decreased. Accordingly, it is understood that, as a result of providing the capacitor C, the size of the surface acoustic wave branching filter can be reduced without decreasing attenuation in the frequency bands corresponding to the second and third harmonics.

Figure 10:
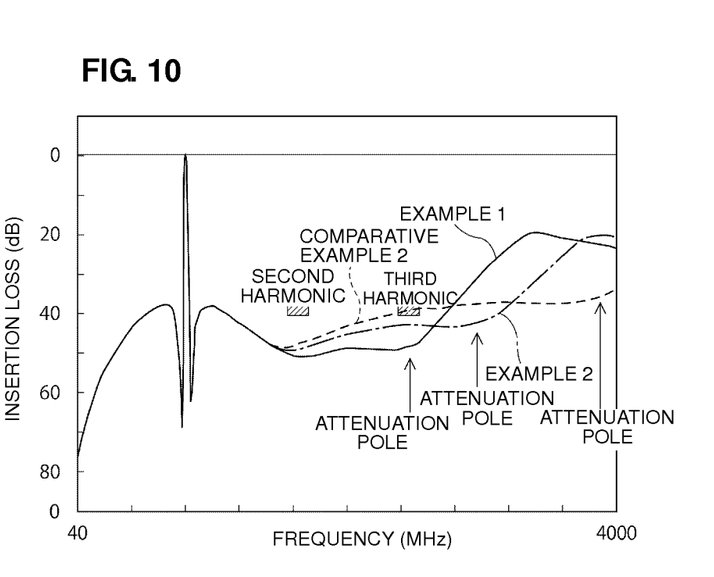
FIG. 10 is a graph illustrating insertion loss characteristics between first and second signal terminals of respective surface acoustic wave branching filters according to Examples 1 and 2 of preferred embodiments of the present invention and a Comparative Example 2.

In a case in which the capacitor C is provided as in the preferred embodiment described above, the position of an attenuation pole generated by the inductor L1 can be adjusted by adjusting a capacitance of the capacitor C without changing an inductance value of the inductor L1. Specifically, as illustrated in FIG. 10, an attenuation pole in Example 1, in which the capacitor C had a capacitance of about 1.0 pF, is located at a frequency of about 2400 MHz. An attenuation pole in Example 2, in which a surface acoustic wave branching filter had substantially the same configuration as that in Example 1 except that a capacitor C had a capacitance of about 0.5 pF, is located at a frequency of about 2800 MHz. An attenuation pole in Comparative Example 2, in which a surface acoustic wave branching filter had substantially the same configuration as that in Example 1 except that a capacitor C was not provided, is located at a frequency of about 4000 MHz. As a result, an increase in capacitance of the capacitor C can shift the position of an attenuation pole generated by the inductor L1 to lower frequencies. Accordingly, attenuation in a frequency band of a third harmonic can be increased by adjusting a capacitance of the capacitor C provided in the transmission-side filter chip 60 without changing the design of the inductor L1, even if the type of the transmission-side filter chip 60 is changed. As illustrated in FIG. 10, the increase in capacitance of the capacitor C can also increase attenuation in a frequency band of a second harmonic. Thus, in multiple types of surface acoustic wave branching filters in which types of transmission-side filter chips 60, demanded characteristics, or other factors are different from each other, the same wiring board 40 can be used by providing the capacitor C.

In the preferred embodiment described above, the electrode 42*a*3 that defines the inductor L1 is preferably connected to the ground terminals 42*b*1 and 42*b*2 provided on the rear surface 42*b* of the wiring board 40. The electrode 42*a*6 that defines the inductor L2 is preferably connected to the ground terminal 42*b*3 provided on the rear surface 42*b* of the wiring board 40. The inductors L1 and L2 are therefore separated from each other in the wiring board 40. However, preferred embodiments of the present invention are not limited to this configuration. In the wiring board 40, the inductors L1 and L2 may be connected to a common ground terminal.

Figure 11:
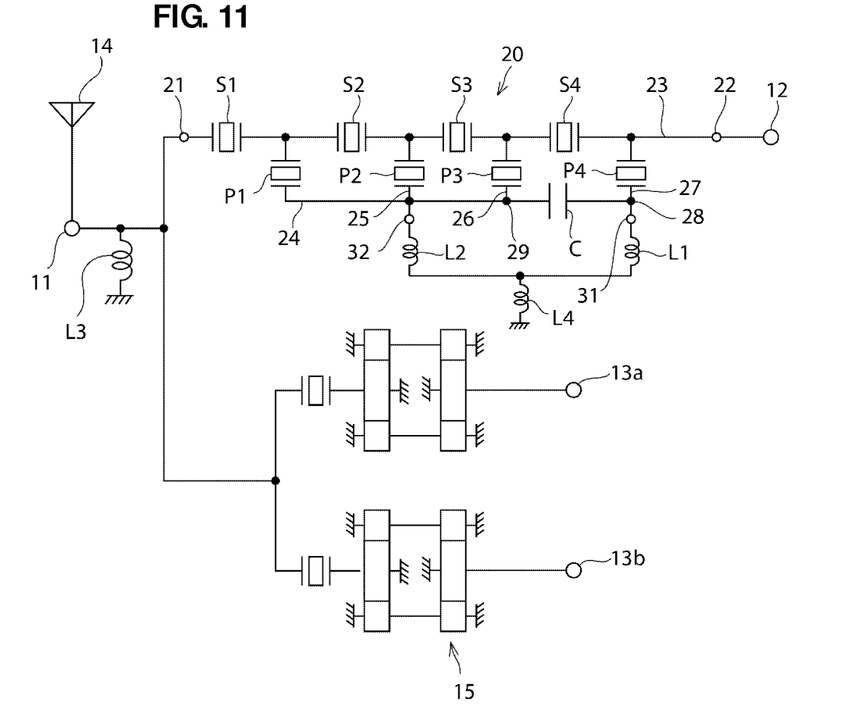
FIG. 11 is a schematic circuit diagram of a surface acoustic wave branching filter according to Example 3 of a preferred embodiment of the present invention.

FIG. 11 is a schematic circuit diagram of a surface acoustic wave branching filter according to Example 3 of a preferred embodiment of the present invention, in which inductors L1 and L2 were connected to a common ground terminal. In Example 3, components having substantially the same functions as those of the above-described preferred embodiment are designated by the same reference numerals and descriptions thereof are omitted.

Figure 12:
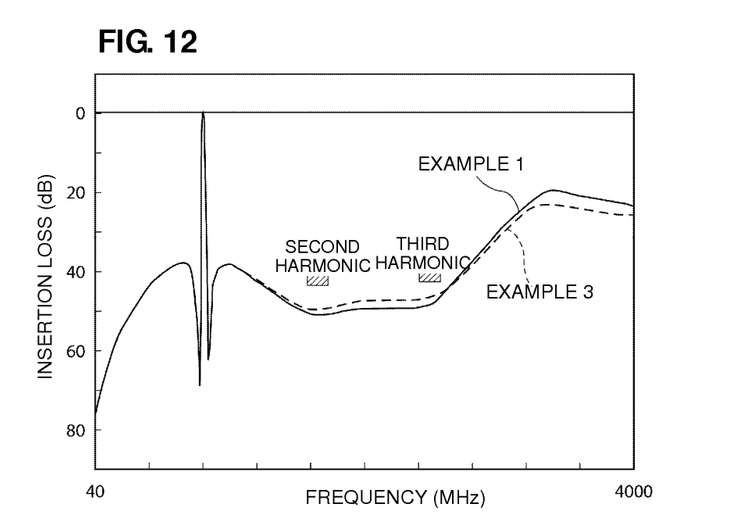
FIG. 12 is a graph illustrating insertion loss between first and second signal terminals of the respective surface acoustic wave branching filters according to Examples 1 and 3.

As illustrated in FIG. 11, in the surface acoustic wave branching filter according to Example 3, wiring between a connection point of the inductors L1 and L2 and the ground terminal defines an inductor L4. FIG. 12 illustrates the insertion losses between first and second signal terminals of the surface acoustic wave branching filter according to Example 3, and the insertion losses between the first and second signal terminals of the surface acoustic wave branching filter according to Example 1. It is understood from the results illustrated in FIG. 12 that attenuation in frequency bands of second and third harmonics can be increased in Example 3, although the degree of increase is less than in Example 1.

A modification of the above-described preferred embodiment will be described below. In the following description, components having substantially the same functions as those of the above-described preferred embodiment are designated by the same reference numerals and descriptions thereof are omitted.

Figure 13:
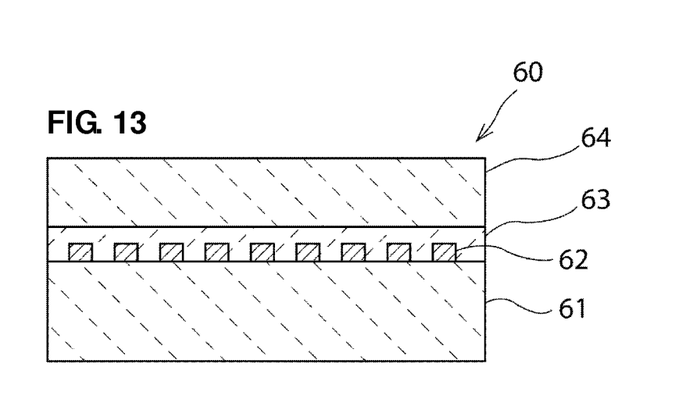
FIG. 13 is a schematic cross-sectional view in which a portion of a transmission-side filter chip in a modification of a preferred embodiment of the present invention is enlarged.

In the above-described preferred embodiment, the transmission-side filter chip 60 is preferably a surface acoustic wave chip. However, preferred embodiments of the present invention are not limited to such a configuration. As illustrated in FIG. 13, for example, the transmission-side filter chip 60 may preferably be a three-medium boundary acoustic wave filter chip that includes, in sequence, a piezoelectric substrate 61, an electrode 62, and first and second dielectric layers 63 and 64 with which the electrode 62 is covered. The transmission-side filter chip 60 may also be a two-medium boundary acoustic wave filter chip that does not include the dielectric layer 64. That is, the elastic wave filter device according to preferred embodiments of the present invention may be a boundary acoustic wave filter device that utilizes boundary acoustic waves.

Materials of the dielectric layers 63 and 64 are not particularly limited as long as the acoustic velocity of the dielectric layer 63 is less than that of the dielectric layer 64. For example, the dielectric layer 63 may be made of silicon oxide, and the dielectric layer 64 may be made of silicon nitride or silicon oxynitride.

In the above-described preferred embodiment, all the parallel arms 24 to 27 are preferably connected to the inductor L1 or L2. However, preferred embodiments of the present invention are not limited to such a configuration, a parallel arm not connected to the inductor L1 or L2 may be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
   a ladder filter unit including first and second signal terminals, a series arm connecting the first and second signal terminals, a plurality of series arm resonators connected in series in the series arm, at least three parallel arms connecting the series arm and a ground potential, the at least three parallel arms including a first parallel arm, and parallel arm resonators provided in the respective at least three parallel arms;
   a first inductor connected between the first parallel arm and the ground potential;
   a second inductor connected between at least two of the parallel arms, other than the first parallel arm among the at least three parallel arms, and the ground potential; and
   a capacitor connected between a connection point of the first parallel arm and the first inductor and a connection point of the second inductor and the at least two parallel arms.

2. The elastic wave filter device according to claim 1, wherein the first and second inductors are configured such that an attenuation pole generated by the first inductor is located on a higher frequency side with respect to an attenuation pole generated by the second inductor.

3. The elastic wave filter device according to claim 1, wherein the first and second inductors are configured such that an attenuation pole generated by the second inductor is located in a frequency band corresponding to a second harmonic of a pass band, and an attenuation pole generated by the first inductor is located in a frequency band corresponding to a third harmonic of the pass band.

4. The elastic wave filter device according to claim 1, further comprising:
   a filter chip in which the ladder filter unit is provided; and
   a wiring board on which the filter chip is mounted and on which electrodes defining the first and second inductors are provided.

5. The elastic wave filter device according to claim 4, wherein the filter chip is flip-chip mounted on a die-attach surface of the wiring board via bumps.

6. The elastic wave filter device according to claim 4, wherein the filter chip is sealed with a sealing resin layer on the wiring board.

7. The elastic wave filter device according to claim 1, wherein neither the first inductor nor the second inductor is connected between all of the at least three parallel arms and the ground potential.

8. The elastic wave filter device according to claim 1, wherein the elastic wave filter device includes a terminal inductor connected between all of the at least three parallel arms and the ground potential.

9. The elastic wave filter device according to claim 1, wherein the elastic wave filter device is a surface acoustic wave filter device.

10. The elastic wave filter device according to claim 1, wherein the elastic wave filter device is a boundary acoustic wave filter device.

11. The elastic wave filter device according to claim 1, wherein the ladder filter unit includes a piezoelectric substrate and an electrode provided on the piezoelectric substrate.

12. The elastic wave filter device according to claim 11, wherein the electrode includes IDT electrodes, reflectors, a pair of comb-shaped electrodes interdigitated with each other, the series arms, and the at least three parallel arms.

13. The elastic wave filter device according to claim 12, wherein the IDT electrodes and the reflectors define each of the plurality of series arm resonators and the parallel arm resonators.

14. The elastic wave filter device according to claim 12, wherein the pair of comb-shaped electrodes define the capacitor.

15. The elastic wave filter device according to claim 11, wherein the piezoelectric substrate is made of one of $LiNbO_3$ and $LiTaO_3$.

16. The elastic wave filter device according to claim 11, wherein the electrode is made of at least one of Al, Pt, Au, Ag, Cu, Ni, Ti, Cr, and Pd, or an alloy containing at least one of Al, Pt, Au, Ag, Cu, Ni, Ti, Cr, and Pd.

17. The elastic wave filter device according to claim 11, wherein the electrode includes a laminate including a plurality of metal layers.

18. The elastic wave filter device according to claim 17, wherein each of the plurality of metal layers of the laminate are made of at least one of Al, Pt, Au, Ag, Cu, Ni, Ti, Cr, and Pd, or an alloy containing at least one of Al, Pt, Au, Ag, Cu, Ni, Ti, Cr, and Pd.

\* \* \* \* \*